US010903330B2

(12) United States Patent
Saia et al.

(10) Patent No.: US 10,903,330 B2
(45) Date of Patent: Jan. 26, 2021

(54) TAPERED GATE ELECTRODE FOR SEMICONDUCTOR DEVICES

(71) Applicant: General Electric Company, Schenectady, NY (US)

(72) Inventors: Richard Joseph Saia, Niskayuna, NY (US); Stephen Daley Arthur, Glenville, NY (US); Zachary Matthew Stum, Niskayuna, NY (US); Roger Raymond Kovalec, Glenville, NY (US); Gregory Keith Dudoff, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 351 days.

(21) Appl. No.: 14/091,622

(22) Filed: Nov. 27, 2013

(65) Prior Publication Data

US 2015/0144960 A1    May 28, 2015

(51) Int. Cl.
*H01L 29/49* (2006.01)
*H01L 29/66* (2006.01)
*H01L 29/423* (2006.01)
*H01L 29/78* (2006.01)
*H01L 29/16* (2006.01)
*H01L 21/04* (2006.01)
(Continued)

(52) U.S. Cl.
CPC ...... *H01L 29/4933* (2013.01); *H01L 21/0273* (2013.01); *H01L 21/049* (2013.01); *H01L 21/32139* (2013.01); *H01L 29/42376* (2013.01); *H01L 29/66068* (2013.01); *H01L 29/7802* (2013.01); *H01L 29/1608* (2013.01)

(58) Field of Classification Search
None
See application file for complete search history.

(56) References Cited

U.S. PATENT DOCUMENTS 4,394,182 A * 7/1983 Maddox, III ....... H01L 21/0277
257/350
6,350,684 B1 * 2/2002 Wang ................... H01L 29/4933
257/E21.2
(Continued)

FOREIGN PATENT DOCUMENTS

KR    20100057113 A    5/2010

OTHER PUBLICATIONS

Koo, San-Mo, Design and Process Issued of Junction-and Ferroelectric-Field Effect Transistors in Silicon Carbide, Vetenskap Och Konst, Stockholm, 2003, pp. 1-120, KTH, Royal Institute of Technology Department of Microelectronics and Information Technology Device Technology Laboratory.
(Continued)

*Primary Examiner* — Jay C Chang
(74) *Attorney, Agent, or Firm* — Fitch, Even, Tabin & Flannery LLP

(57) ABSTRACT

The subject matter disclosed herein relates to metal-oxide-semiconductor (MOS) devices, such as silicon carbide (SiC) power devices (e.g., MOSFETs, IGBTs, etc.) In an embodiment, a semiconductor device includes a gate oxide layer disposed on top of a semiconductor layer. The semiconductor device also includes a gate electrode having a tapered sidewall. Further, the gate electrode includes a polysilicon layer disposed on top of the gate oxide layer and a metal silicide layer disposed on top of the polysilicon layer.

20 Claims, 9 Drawing Sheets

(51) Int. Cl.
*H01L 21/3213* (2006.01)
*H01L 21/027* (2006.01)

(56) References Cited

U.S. PATENT DOCUMENTS

| | | | |
|---|---|---|---|
| 7,224,021 B2 | 5/2007 | Chidambarrao et al. | |
| 7,655,514 B2 | 2/2010 | Zhang et al. | |
| 7,816,261 B2 | 10/2010 | Zhu et al. | |
| 8,053,348 B2 | 11/2011 | Anderson et al. | |
| 8,349,692 B2 | 1/2013 | Tan et al. | |
| 2001/0022371 A1* | 9/2001 | Rhodes | 257/290 |
| 2002/0061639 A1* | 5/2002 | Itonaga | H01L 21/28052 438/592 |
| 2006/0189110 A1* | 8/2006 | Mandelman et al. | 438/593 |
| 2008/0054350 A1* | 3/2008 | Breitwisch et al. | 257/330 |
| 2008/0093676 A1* | 4/2008 | Shingu | H01L 21/28052 257/386 |
| 2009/0098702 A1* | 4/2009 | Kirkpatrick et al. | 438/296 |
| 2010/0297840 A1* | 11/2010 | Kim | H01L 21/28247 438/592 |
| 2010/0301421 A1* | 12/2010 | Kronholz et al. | 257/369 |
| 2011/0284935 A1* | 11/2011 | Yamada | H01L 21/76897 257/288 |
| 2012/0032151 A1* | 2/2012 | Hama | G02B 5/223 257/40 |
| 2012/0037954 A1 | 2/2012 | Hshieh | |
| 2012/0161154 A1 | 6/2012 | Mimura et al. | |
| 2012/0168829 A1* | 7/2012 | Zhong | H01L 29/4983 257/288 |
| 2012/0256193 A1* | 10/2012 | Hebert | H01L 28/60 257/77 |
| 2013/0146898 A1 | 6/2013 | Matocha et al. | |
| 2013/0256698 A1* | 10/2013 | Sdrulla | H01L 21/049 257/77 |

OTHER PUBLICATIONS

Yano et al., "Anomalously Anisotropic Channel Mobility on Trench Sidewalls in 4H-SiCtrench-gate Metal-oxide-Semiconductor Field-effect Transistors Fabricated on 8° Off Substrates", IEEE transactions on Applied Physics Letters, vol. 90, Issue 4, pp. 042102-042103, Jan. 2007.

Chu, "Gate-recessed Gallium Nitride High Electron Mobility Transistors with Scaled Gate Length", Google Books, pp. 41 and 63, Dec. 2008.

Koketsu et al., "Control of Inclined Sidewall Angles of 4H—SiC Mesa and Trench Structures", Material science forum, vol. 679-680, pp. 485-488, Mar. 2011.

* cited by examiner

US 10,903,330 B2

TAPERED GATE ELECTRODE FOR SEMICONDUCTOR DEVICES

BACKGROUND

The subject matter disclosed herein relates to metal-oxide-semiconductor (MOS) devices, such as silicon carbide (SiC) power devices (e.g., MOSFETs, IGBTs, etc.).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Power conversion devices are widely used throughout modern electrical systems to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), junction gate field-effect transistor (JFETs), insulated gate bipolar transistors (IGBTs), and other suitable transistors), in this power conversion process.

Specifically for high-voltage and/or high-current applications, devices utilizing wide bandgap semiconductors, such as silicon carbide (SiC), aluminum nitride (AlN), gallium nitride (GaN), etc., may afford a number of advantages in terms of high temperature operation, reduced ON-resistance, and smaller die size than corresponding silicon (Si) devices. Accordingly, wide bandgap semiconductor devices offer advantages to electrical conversion applications including, for example, power distribution systems (e.g., in electrical grids), power generation systems (e.g., in solar and wind converters), as well as consumer goods (e.g., electric vehicles, appliances, power supplies, etc.). For many semiconductor devices, such as SiC power devices, reliability is highly desirable. That is, it may be desirable to produce semiconductor devices (e.g., MOSFET devices) that exhibit long lifetimes, even after extended exposure to high-temperature and high-bias conditions.

BRIEF DESCRIPTION

Certain embodiments commensurate in scope with the originally claimed subject matter are summarized below. These embodiments are not intended to limit the scope of the claimed invention, but rather these embodiments are intended only to provide a brief summary of possible forms of the invention. Indeed, the present disclosure may encompass a variety of forms that may be similar to or different from the embodiments set forth below.

In an embodiment, a semiconductor device includes a gate oxide layer disposed on top of a semiconductor layer. The semiconductor device also includes a gate electrode having a tapered sidewall. Further, the gate electrode includes a polysilicon layer disposed on top of the gate oxide layer and a metal silicide layer disposed on top of the polysilicon layer.

In another embodiment, a method of manufacturing a metal-oxide semiconductor (MOS) device includes forming a photoresist layer over a portion of a surface of the MOS device, wherein the photoresist layer has a first tapered edge. The method includes plasma etching the surface of the MOS device such that the first tapered edge of the photoresist layer imparts a second tapered edge in at least one layer of the MOS device disposed below the photoresist layer.

In another embodiment, a semiconductor substrate includes an oxide layer disposed over a surface of the semiconductor substrate and a polysilicon layer disposed over a portion of the gate oxide layer. The polysilicon layer has a tapered edge that is disposed at an angle relative to the surface of the semiconductor substrate, wherein the angle is less than 90 degrees. The semiconductor substrate also includes a photoresist layer disposed above the polysilicon layer, wherein the photoresist layer has a rounded edge disposed near the tapered edge of the polysilicon layer.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
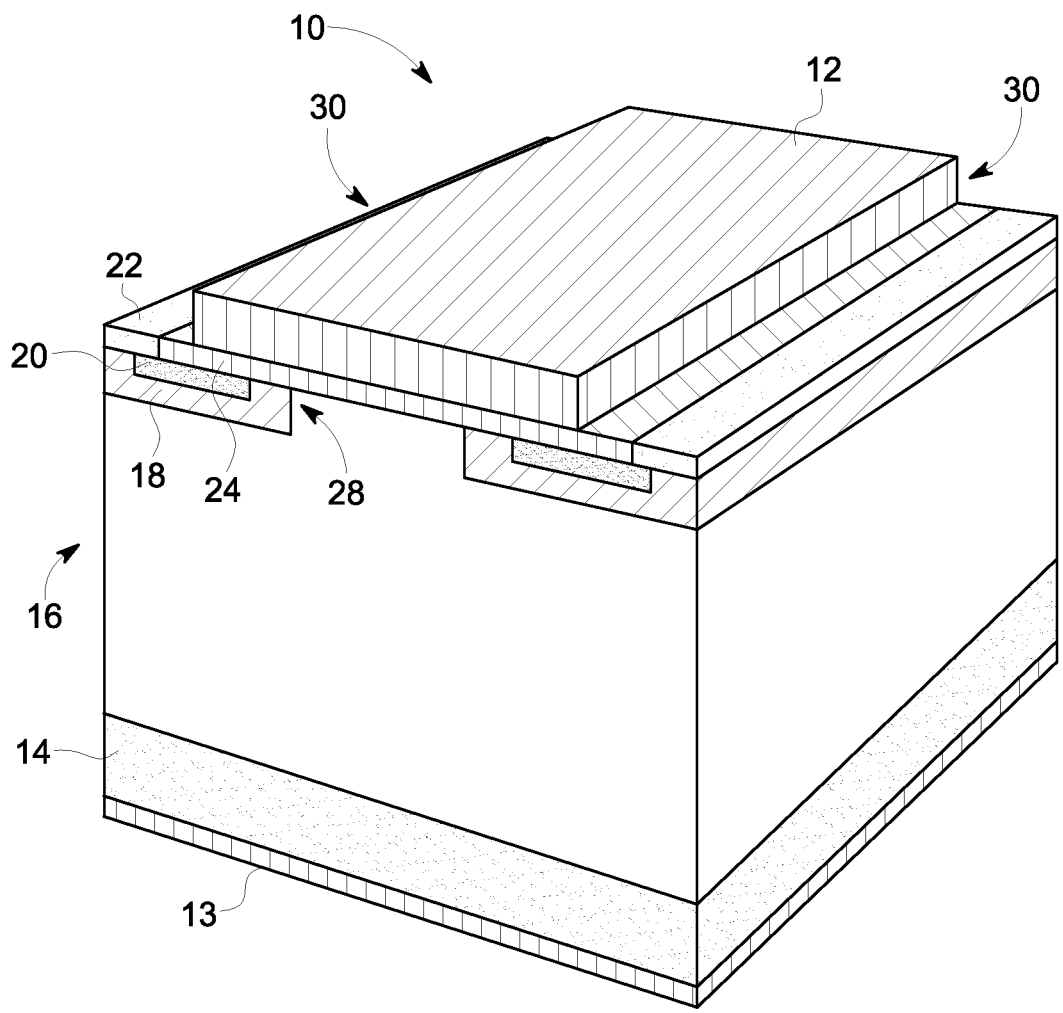
FIG. 1 is a schematic of a typical planar metal-oxide-semiconductor field-effect transistor (MOSFET) device.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. It should be understood that, in describing the layers of the semiconductor devices, the terms "above" and "below," as used herein, may designate a relative position of two layers that may or may not be in direct contact with one another. It should also be understood that the terms "over," "on top of," and "directly below," as used herein, designate the relative position of two layers that are in direct contact with one another.

Many modern semiconductor devices rely in a relatively thin gate oxide layer to electrically isolate the gate electrode from other components of the semiconductor device structure. As such, for many semiconductor devices, this thin gate oxide layer may be a principle limiting factor in the reliability and lifetime of the device. Accordingly, different techniques have been explored for improving reliability of MOS devices. Certain techniques focus on the quality of the gate oxide itself, including, for example, techniques involving special anneals of the gate oxide layer, the use of thicker gate oxide layers, the use of different types of gate materials, and so forth. However, these techniques generally involve some performance trade-off in exchange for the improved reliability.

With the foregoing in mind, present embodiments are directed toward improving the reliability in semiconductor devices, such as SiC MOS devices, without sacrificing device performance. Present embodiments improve the reliability of the gate oxide layer by providing a MOS device having a gate electrode with sloped or tapered sidewalls. For example, as set forth below, during the photolithographic patterning of the gate electrode layer of the device, a high-temperature reflow bake may be used to round or taper the edges of a photoresist disposed over the gate electrode. As such, as set forth below, when the edges of the gate electrode are plasma etched, the rounded or tapered edges of the photoresist may impart sloping or tapered edges to the sidewalls of the gate electrode, which remains after the photoresist is subsequently removed. Additionally, as set forth in detail below, the presently disclosed tapered gate electrode design enables a cleaner gate oxide layer (e.g., with little to no etching byproducts) with a controlled thickness (e.g., due to reduced trenching of the gate oxide at the edge of the gate electrode). These improvements enable the fabrication of a semiconductor device having greater reliability and/or performance when compared to the similar semiconductor devices having gate electrodes with substantially vertical sidewalls or edges.

It may be appreciated that the presently disclosed semiconductor designs may be applicable to controlling the sidewall geometry of a polysilicon layer, such as a polysilicon layer of a gate electrode of a MOS device (e.g., MOSFETs, insulated gate bipolar transistors (IGBTs), insulated base MOS-controlled thyristor (IBMCT), base resistance MOS-Controlled thyristor (BRT), etc.). Additionally, in certain embodiments, semiconductor devices of the present approach may be manufactured from silicon (Si), germanium (Ge), aluminum nitride (AlN), gallium nitride (GaN), gallium arsenide (GaAs), diamond (C), or any other semiconductor that may utilize a polysilicon layer (e.g., a polysilicon gate electrode). Further, it may be appreciated that, while the present technique is discussed herein in terms of fabricating a gate electrode having a tapered sidewall, the present approach may be useful for fabricating any polysilicon structure having a tapered or sloping edge or sidewall.

With the foregoing in mind, FIG. 1 illustrates an active cell of a planar n-channel field-effect transistor, namely a DMOSFET, hereinafter MOSFET device 10, having a gate electrode 12 with a substantially vertical edge. It may be appreciated that, in order to more clearly illustrate certain components of the MOSFET device 10, as well as other devices discussed below, certain commonly understood design elements (e.g., top metallization, passivation, edge termination, and so forth) may be omitted. The illustrated MOSFET device 10 of FIG. 1 includes a drain contact 13 disposed on the bottom of the device, below an n-type substrate layer 14. Above the substrate layer 14, an n-type drift layer 16 is disposed. Near the surface of the MOSFET device 10, p-well 18 (e.g., well region 18) and an n+ region 20 are situated below a source contact 22. Further, a gate oxide layer 24 isolates a gate 26 from the n+ region 20 and the p-well 18. During operation, an appropriate gate voltage (e.g., at or beyond a threshold voltage ($V_{TH}$) of the MOSFET device 10) may cause an inversion layer to form in the channel region 28, as well as a conductive path to form in the junction gate field-effect transistor (JFET) region 29, allowing current to flow between the source contact 22 and the drain contact 12.

Additionally, for the MOSFET device 10 illustrated in FIG. 1, the sidewalls 30 of the gate electrode 12 are substantially vertical. That is, the sidewalls 30 of the illustrated gate electrode 12 are oriented substantially orthogonal (e.g., approximately) 90° relative to the surface of the semiconductor device 10. It may be appreciated that, during the manufacture of the gate electrode 12 of the illustrated MOSFET device 10, the gate oxide layer 24 may first be formed (e.g., grown and/or deposited) over the surface of the semiconductor device 10. Subsequently, one or more gate electrode layers may be formed (e.g., grown and/or deposited) on top of the gate oxide layer 24. Then, photolithography may be used to pattern the one or more gate electrode layers into the gate electrode 12. For example, once a photoresist has been deposited and developed, portions of the one or more gate electrode layers may be exposed after undeveloped portions of a photoresist are subsequently removed. As such, these exposed portions of the gate electrode layers may be removed during plasma etching (e.g., using an inductively coupled plasma (ICP) processing system), defining the vertical edges 30 of the gate electrode 12.

It may be appreciated that forming the vertical sidewalls 30 of the gate electrode 12, as illustrated in FIG. 1, hinders reliability of the gate oxide layer 24 for at least two reasons. First, when plasma etching to form the vertical sidewalls 30 of the gate electrode 12, a typical photoresist layer disposed over the one or more gate electrode layers may have substantially vertical sidewall. This substantially vertical sidewall of the photoresist is highly susceptible to accumulating contaminants and byproducts formed during the etching process. These byproducts may include conductive elements, such as metals, that may become incorporated into the gate oxide layer 12 after removing the photoresist layer, diminishing the effectiveness of the gate oxide layer 12.

Secondly, once the vertical sidewalls 30 of the gate electrode 12 are formed during a plasma etching process, the vertical sidewalls 30 may subsequently increase the etching rate of the gate oxide layer 24 disposed directly beneath the vertical sidewalls 30, which is commonly known as "trenching." As such, the vertical sidewalls 30 may lead to a significant amount of trenching of the gate oxide layer 24 at the edges of the gate electrode 24. This trenching effect may lead to thinner gate oxide layers 24 near the vertical sidewalls 30 of the gate electrode 24, which may result in shorter device lifetimes and poorer device reliability.

Figure 2:
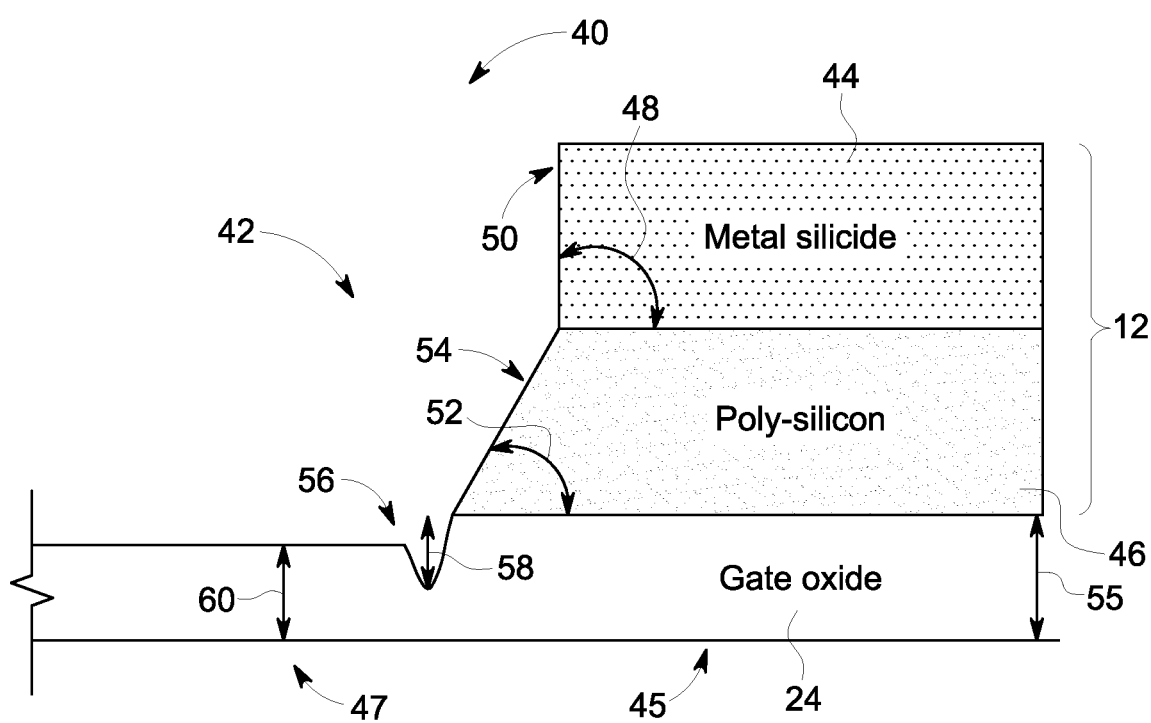
FIG. 2 is a schematic cross-section of a semiconductor device having a tapered gate electrode, in accordance with an embodiment of the present approach.

In contrast, FIG. 2 is a schematic illustrating a portion of a semiconductor device 40 having a gate electrode 12 with a sloped or tapered sidewall 42, in accordance with an embodiment of the present approach. The gate electrode 12 of the illustrated semiconductor device 40 includes a metal silicide layer 44 (e.g., a metal silicide sublayer 44 of the gate electrode layer 12), which is disposed on top of a polysilicon layer 46 (e.g., a polysilicon sublayer 46 of the gate electrode layer 12). In certain embodiments, the metal silicide layer 44 may include tantalum silicide, nickel silicide, cobalt silicide, titanium silicide, molybdenum silicide, tungsten silicide, niobium silicide, hafnium silicide, zirconium silicide, vanadium silicide, chromium silicide, and/or platinum silicide. In certain embodiments, the metal silicide layer 44 may include tantalum silicide having a particular relative ratio between the number of silicon atoms per tantalum atom (e.g., a particular formula) in the layer. It may be appreciated that, in general, a more Si-rich metal silicide layer 44 may advantageously have a lower level of stress, but may also provide lower conductivity and/or a higher void density. Conversely, if too little Si is present when forming the metal silicide layer 44, a portion of the polysilicon layer 46 may be inadvertently consumed and the resulting metal silicide layer 44 may have a higher stress. For example, in certain embodiments, the number of silicon atoms per tantalum atom may be any value between approximately 2 and 4 (e.g., $TiSi_2$-$TiSi_4$), such as 2.7 (e.g., $TiSi_{2.7}$) or 3.3 (e.g., $TiSi_{3.3}$). In certain embodiments, the polysilicon layer 46 may be a highly doped (e.g., highly N or P doped) polysilicon layer. Additionally, in certain embodiments, the gate electrode 12 may include additional layers (e.g., additional metal silicide layers) without negating the effect of the present approach.

Additionally, FIG. 2 illustrates the angle 48 of the edge 50 of the metal silicide layer 44, as well as the angle 52 of the edge 54 of the polysilicon layer 42, relative to the surface of the semiconductor device. It may be appreciated that the edges 58 and 62 together form the sidewall 42 of the gate electrode 12. As illustrated, the angle 48 of the edge 50 of the metal silicide layer 44 may, in certain embodiments, be less than or equal to approximately 90° (e.g., between approximately 70° and approximately 90°). The illustrated angle 52 of the substantially tapered edge 54 of the polysilicon layer 42 may, in certain embodiments, be less than 90°, or between approximately 50° and approximately 90°, between approximately 55° and approximately 85°, between approximately 60° and approximately 80°, between approximately 65° and approximately 75°, or approximately 70°. As discussed in greater detail below, the angles 48 and 52 may be influenced by the angle of the sidewall of a photoresist layer disposed above the gate electrode 12, as well as the relative vertical and lateral etching rates of the metal silicide layer 44 and the polysilicon layer 46, during plasma etching.

Further, for the semiconductor device 40 illustrated in FIG. 2, the two layers 44 and 46 of the gate electrode 12 are disposed on top of the gate oxide layer 24, which electrically isolates the gate electrode 12 from other portions of the semiconductor device 40 disposed below the gate oxide layer 24. The gate oxide layer 24 includes a first portion 45 that is disposed directly under the gate electrode 12 and includes a second portion 47 that is not disposed directly under the gate electrode 12. As illustrated in FIG. 2, in certain embodiments, the first portion 45 of the gate oxide layer 24 may have thickness 55 (e.g., between approximately 475 Å and approximately 600 Å, or approximately 500 Å) that is substantially retained during the plasma etch. Meanwhile, the exposed second portion 47 of the gate oxide layer 24 may be thinned (e.g., by between approximately 75 Å and approximately 200 Å) during plasma etching to achieve a thickness 60 (e.g., approximately 350 Å). As discussed in greater detail below, in certain embodiments, the second portion 47 of the gate oxide layer 24 may be thinned by between approximately 20% and approximately 35% or between approximately 20% and approximately 45%. As such, in certain embodiments, after plasma etching, the second portion 47 of the gate oxide layer 24 may have a thickness between approximately 275 Å and approximately 400 Å, or between approximately 300 Å and approximately 375 Å, after between approximately 100 Å and approximately 175 Å of the gate oxide layer 24 is removed.

As with the trenching effect described above with respect to the MOSFET device 10, the tapered sidewall 42 may somewhat increase the rate of etching of the gate oxide layer 24 near the sidewall 42 relative to the remainder of the portion 47 of the gate oxide layer 24. As illustrated in FIG. 2, a shallow trench 56 (e.g., microtrench 56 having a depth 58 of approximately 120 Å or less) may form near the sidewall 42 of the gate electrode 12 while thinning the second portion 47 of the gate oxide layer 24 to the desired thickness 60 (e.g., approximately 350 Å). It should be appreciated that the increased etching rate produced by the tapered sidewall 42 may be significantly less than the increased etching rate produced by the vertical sidewalls (e.g., vertical sidewalls 30 illustrated in FIG. 1) of the MOSFET device 10. As such, in certain embodiments, the gate oxide layer 24 may be substantially free or completely free of microtrenches 56 near the tapered sidewall 42 of the gate electrode 12. Therefore, the reduced trenching enabled by the tapered sidewall 42 either provides shallower trenches 56 or eliminates them altogether, thereby improving the quality of the gate oxide layer 24, especially near the edges of the gate electrode 12.

Figure 3:
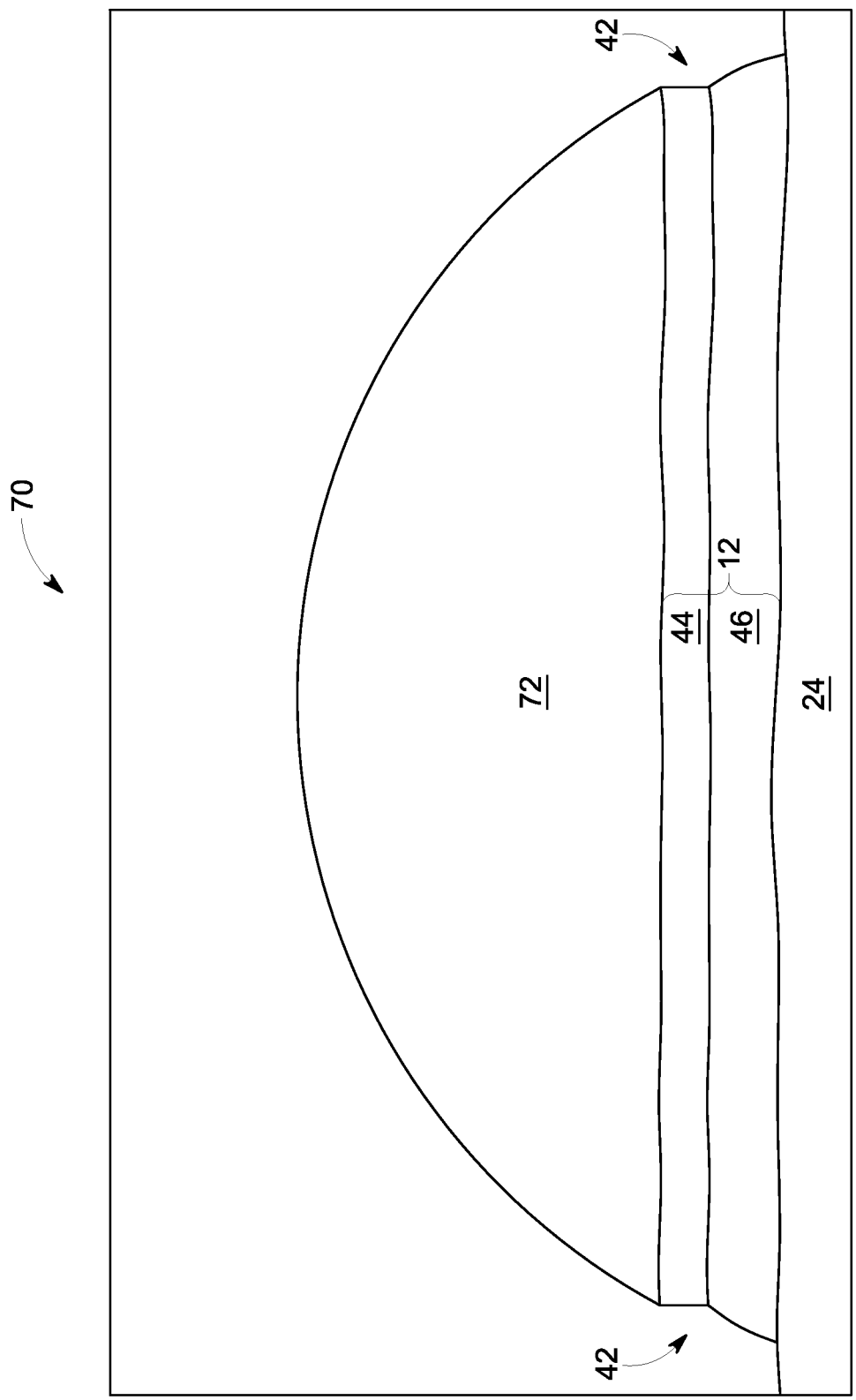
FIG. 3 is an illustration of a cross-sectional view of a tapered gate electrode after plasma etching, in accordance with an embodiment of the present approach.
Figure 4:
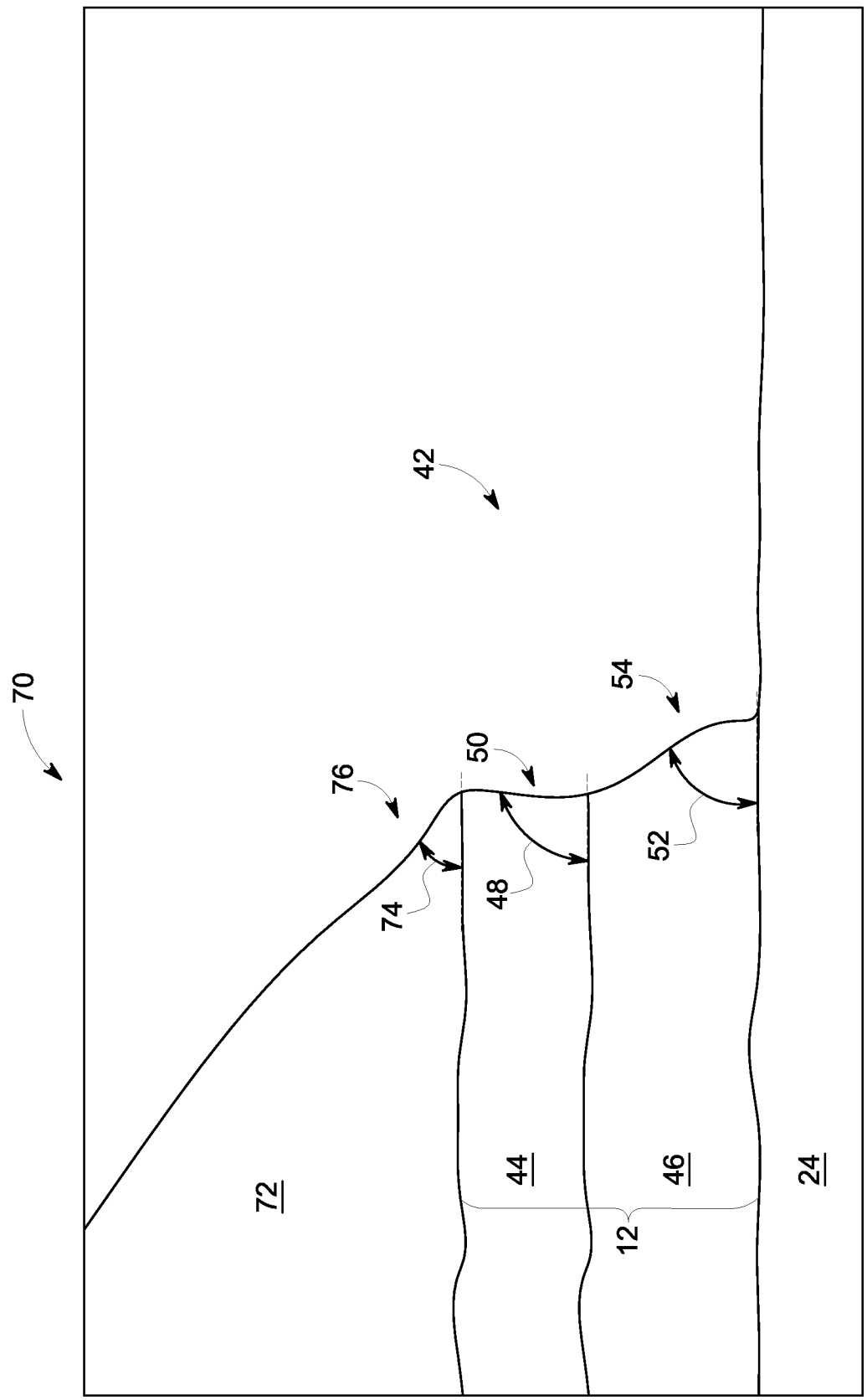
FIG. 4 is an enlarged view of the tapered gate electrode of FIG. 3.
Figure 7:
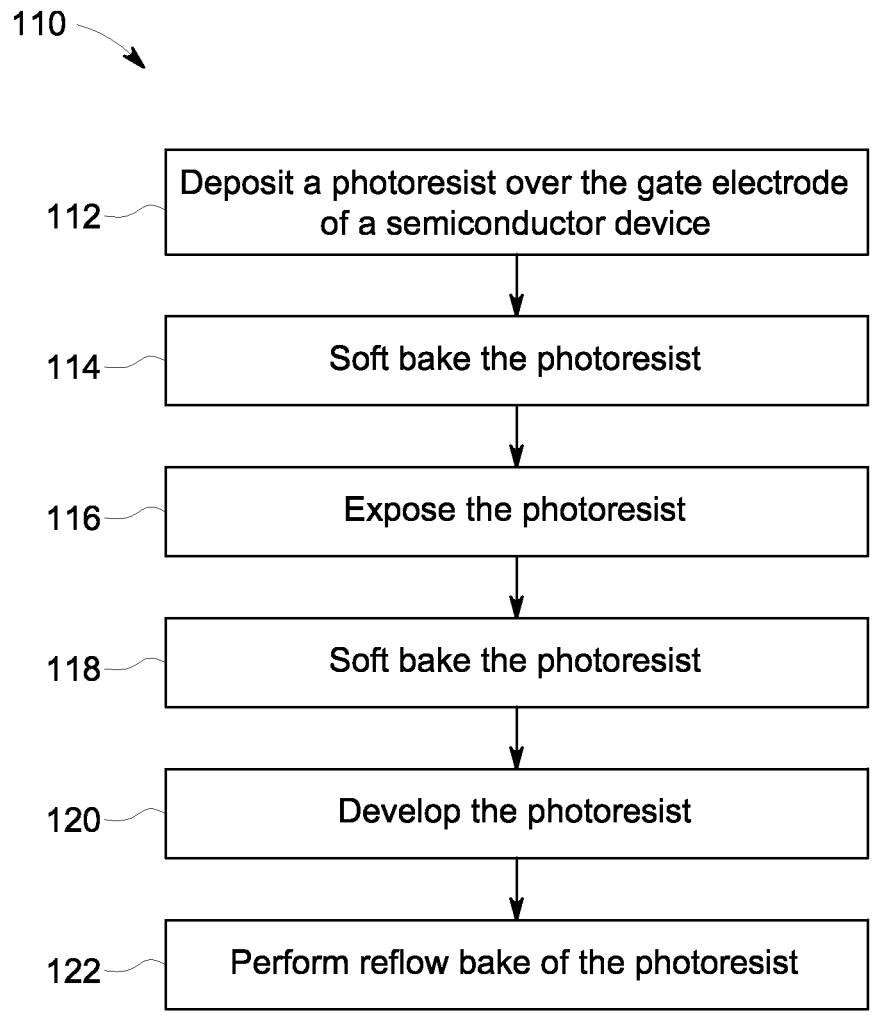
FIG. 7 is a flow diagram illustrating a process by which a photoresist material may be deposited, developed, and shaped, in accordance with an embodiment of the present approach.

FIG. 3 is an illustration of a cross-section of a top portion of a semiconductor device 70 after plasma etching, in accordance with an embodiment of the present approach. More specifically, FIGS. 3 and 4 are line drawing representations of scanning electron microscope (SEM) images collected during cross-sectional analysis of the semiconductor device 70. As such, FIGS. 3 and 4 illustrate the layers of the semiconductor device 70 as having minor imperfections (e.g., layers that are not perfectly planar, edges that are not perfectly straight, and so forth) that are common to the semiconductor fabrication techniques currently employed in the field, as may be appreciated by those skilled in the art. Like the semiconductor device 40 illustrated in FIG. 2, the semiconductor device 50 includes a gate electrode 24 having a bottom polysilicon layer 46 and having an upper metal silicide layer 44 disposed on top of the gate oxide layer 24. However, unlike the semiconductor device 40 illustrated in FIG. 2, for the semiconductor device 50 illustrated in FIG. 3, the photoresist layer 72 has not yet been removed from the surface of the gate electrode 12 (e.g., using a plasma ashing process) so that the rounded shape (e.g., tapered or sloped shape) of the photoresist layer 72 may be appreciated. As set forth in detail below with respect to FIG. 7, in certain embodiments, certain process steps may be performed to deposit, develop, and shape a photoresist material into a rounded photoresist layer 72 (e.g., a photoresist layer 72 with tapered sidewalls or edges), as illustrated in FIG. 3.

FIG. 4 is an illustration depicting an enlarged view of one of the sidewalls 42 of the semiconductor device 70 illustrated in FIG. 3. As such, FIG. 4 illustrates the various layers (e.g., the gate oxide layer 24, the polysilicon layer 46 and the metal silicide layer 44 of the gate electrode 12, and the rounded photoresist layer 72) discussed above. In addition to the angles 48 and 52 discussed above, FIG. 4 includes angle 74, which is the angle of the edge 76 of the rounded or tapered photoresist layer 72. In certain embodiments, the angle 74 may be between approximately 30° and approximately 70°, between approximately 35° and approximately 65°, between approximately 40° and approximately 60°, between approximately 45° and approximately 55°, or approximately 50°.

It may be appreciated that, during the aforementioned plasma etch process that forms tapered gate electrode 12 illustrated in FIGS. 3 and 4, the rounded photoresist layer 72, the metal silicide layer 44, and the polysilicon layer 46 may each have a vertical etch rate and a lateral etch rate that influences the resulting shape of the sidewall 42. For example, in an embodiment, the photoresist layer 52, the metal silicide layer 44, and the top of the polysilicon layer 46 may all have an effective lateral etch rate of approximately 570 Å/min, while the bottom of the polysilicon layer 46 (e.g., closest to the gate oxide layer 24) may have an effective lateral etch rate of approximately 0 Å/min. Additionally, for such an embodiment, the photoresist layer 52 may have a vertical etch rate of approximately 1500 Å/min, the metal silicide layer 44 may have a vertical etch rate of approximately 5500 Å/min, and the polysilicon layer 46 may have a vertical etch rate of approximately 2700 Å/min. Accordingly, the rapid vertical etching rate of the metal silicide layer 44, which greatly exceeds the lateral etch rate, resulting in a substantially vertical metal silicide layer 44. Further, the substantial lack of etching at the bottom of the polysilicon layer 46 compared to the substantial etching of the top of the polysilicon layer 46, the photoresist layer 52, and metal silicide layer 44 contributes to forming the angle 52 of the edge 54 of the polysilicon layer, contributing to the tapered sidewall 42 of the gate electrode 12.

Figure 5:
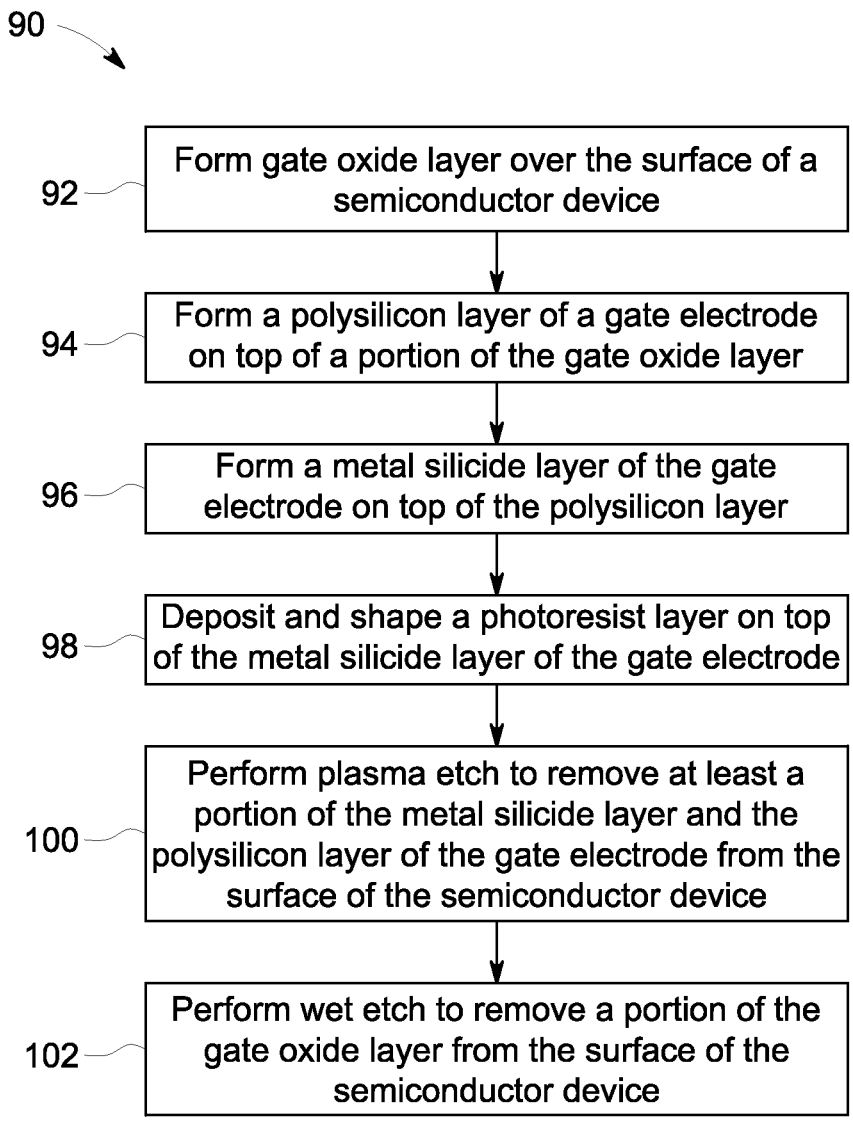
FIG. 5 is a flow diagram illustrating a process by which a tapered gate electrode may be manufactured, in accordance with an embodiment of the present approach.

FIG. 5 is a flow diagram illustrating an embodiment of a process 90 by which a tapered gate electrode 12 may be fabricated. The illustrated process 90 begins with forming (block 92) a gate oxide layer 24 over the surface of a semiconductor device (e.g., a SiC MOSFET device) during fabrication. A polysilicon layer 46 of a gate electrode 12 may then be formed (block 94) on top of a portion of the gate oxide layer 24. Subsequently, a metal silicide layer 44 of the gate electrode 12 may be formed (block 96) on top of the polysilicon layer 46. Next, a photoresist layer 72 may be deposited and shaped (block 98) on top of the metal silicide layer 44 of the gate electrode 12, as discussed in detail below with respect to FIG. 7.

Figure 9:
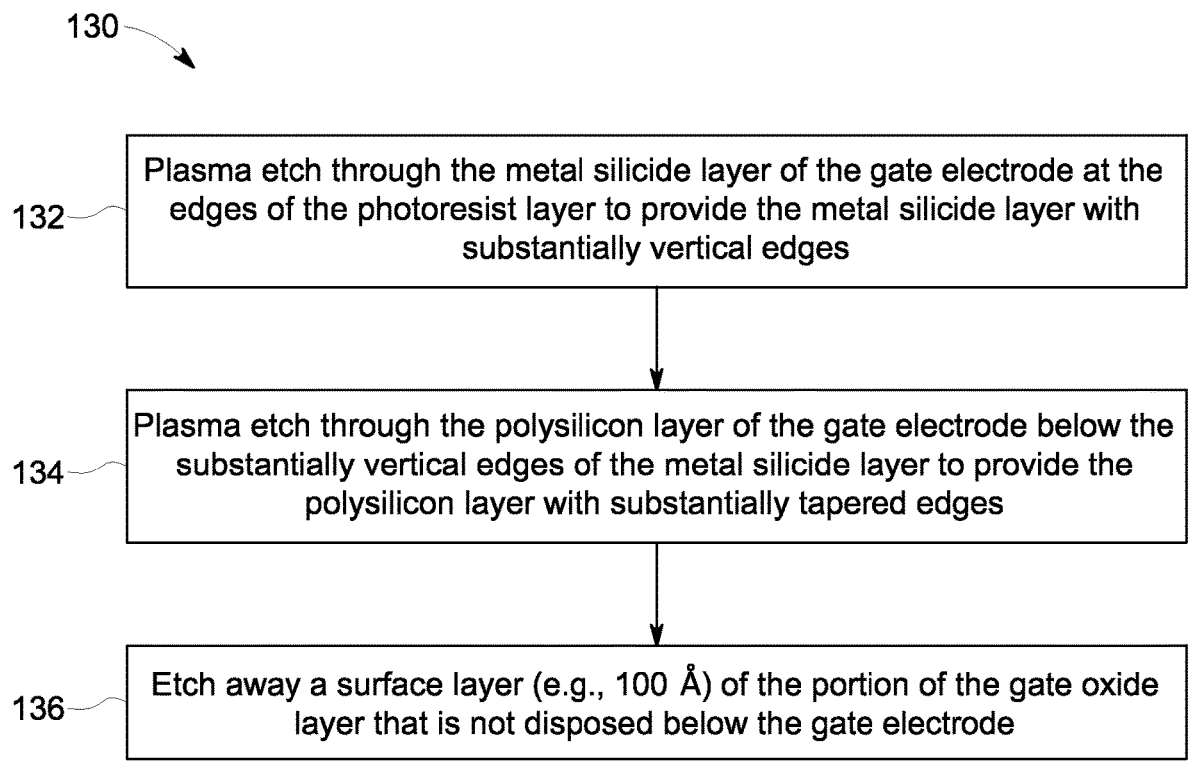
FIG. 9 is a flow diagram illustrating a process for plasma etching to form the tapered gate electrode, in accordance with an embodiment of the present approach.

Continuing through the process 90 illustrated in FIG. 5, after forming the rounded photoresist layer 72, plasma etching may be performed (block 100) to remove at least a portion of the metal silicide layer 44 and the polysilicon layer 46 of the gate electrode 12 from the surface of the semiconductor device 40, as discussed in greater detail below with respect to FIG. 9. Additionally, in certain embodiments, during the plasma etch, a portion of the gate oxide layer 24 may be intentionally removed from the surface of the semiconductor device in order to remove any contaminants that may be present in the surface of the gate oxide layer 24. Furthermore, in certain embodiments, additionally or alternatively a wet etch (e.g., 2% hydrofluoric acid (HF) for approximately 70 seconds) may be performed (block 102) to remove a portion of the exposed surface of the gate oxide layer 24 after plasma etching is completed. For such embodiments, this wet etch may remove a top surface (e.g., approximately 120 Å) of the gate oxide layer, which may remove the small trench 56 discussed above with respect to FIG. 2 that may be formed near the tapered sidewall 42 of the gate electrode 12 during plasma etching. Further, for such embodiments, this wet etch may remove contamination from the etching process, remove a plasma damage layer formed as a side-effect of the plasma etch process, and clean residue from the sidewalls of the gate (e.g., including remaining metallic veils), while removing the gate oxide in a reasonable and controllable amount of time.

Figure 6:
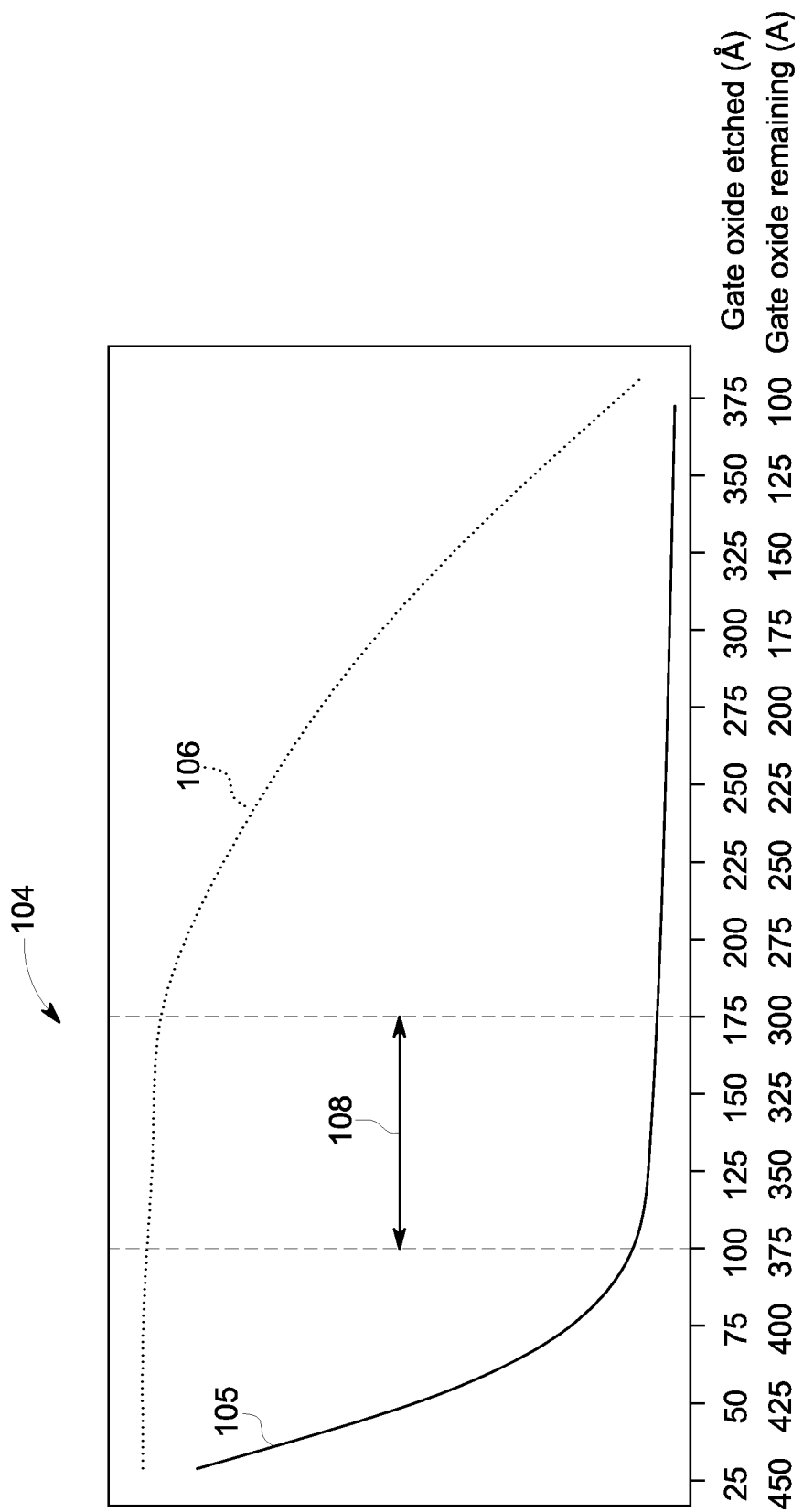
FIG. 6 is a graph illustrating leakage and reliability for an embodiment of a semiconductor device of the present approach as a function of gate oxide removed and gate oxide remaining after one or more etching steps.

It may be appreciated that it is desirable to control the thickness of the gate oxide (e.g., the thickness 60 of the portion of the gate oxide layer that is not disposed under the gate electrode) when plasma etching and/or wet etching the surface of the semiconductor device 40. For example, FIG. 6 illustrates a graph 104 that includes two curves: curve 105 and curve 106. The curve 105 illustrates a general trend for semiconductor device leakage as a function of the gate oxide layer 24 removed/remaining from a semiconductor device embodiment that has an initial gate oxide thickness (e.g., thickness 55 illustrated in FIG. 2) of approximately 475 Å. The curve 106 illustrates a general trend for device reliability as a function of the gate oxide layer 24 removed/remaining for the embodiment of the semiconductor device 40. Accordingly, the range 108 illustrates a desired gate oxide thickness to be achieved after one or more etching steps for the semiconductor device embodiment. That is, as illustrated by the range 108, it may be desirable to remove approximately 100 Å to approximately 175 Å of the gate oxide layer 24 to achieve a gate oxide thickness 60 between approximately 300 Å and approximately 375 Å for the illustrated embodiment of the semiconductor device 40. In other words, in certain embodiments, it may be desirable to remove between approximately 20% and approximately 35% of the gate oxide layer 24, leaving approximately 80% to approximately 65% of the gate oxide layer 24 remaining in order to achieve a semiconductor device with suitable leakage and reliability.

As mentioned above, FIG. 7 illustrates an embodiment of a process 110 (represented by block 98 of FIG. 5) whereby the photoresist layer 72 may be deposited and suitably shaped prior to plasma etching of the surface of the semiconductor device 40. The illustrated process 110 begins with depositing (block 112) a photoresist (e.g., approximately 1.3 µm) over the gate electrode 12 of the semiconductor device 40. Then, the photoresist may be soft baked (block 114) (e.g., approximately 1 minute at approximately 110° C.) prior to selectively exposing (block 116) portions of the photoresist to a suitable light source (e.g., approximately 200 mJ/cm$^2$). Subsequently, the photoresist may be soft baked (block 114) once again (e.g., approximately 1 minute at approximately 110° C.) prior to developing (block 120) the photoresist (e.g., for approximately 75 seconds). Finally, a higher temperature reflow bake of the photoresist may be performed (block 122) (e.g., approximately 3 minutes at approximately 170° C.) in order to impart a rounded shape (e.g., the rounded or tapered sidewalls or edges 76) to the photoresist 72 that is illustrated in FIG. 3. In other words, the reflow bake may generally approach or reach a melting point or melting point range of the photoresist layer such that the substantially vertical edges at least partially melt to form rounded (e.g., tapered or sloped) edges or sidewalls 76. As such, the reflow bake step produces a rounded photoresist sidewall profile, as illustrated in FIG. 3, which, in addition to helping impart the tapered shape to the sidewall 42 of the gate electrode 12, may help to prevent inorganic sidewall residue accumulation during the subsequent plasma etching process.

Figure 8:
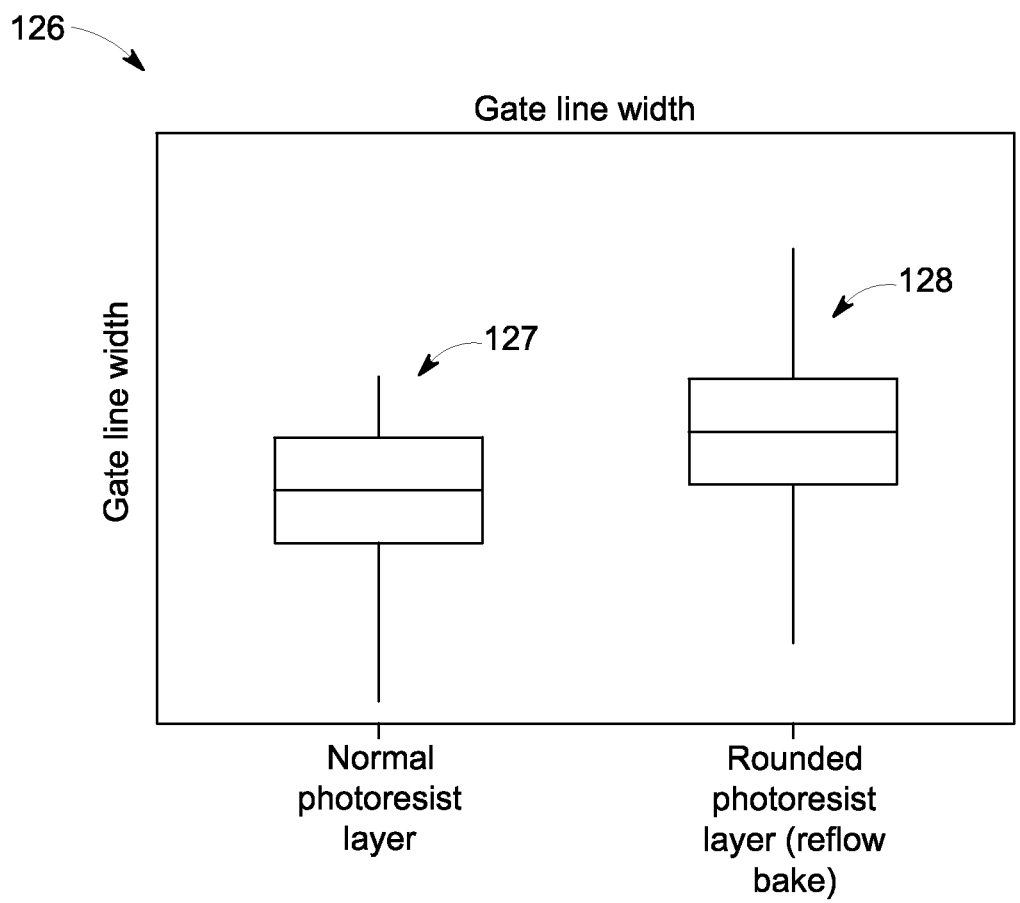
FIG. 8 is a graph illustrating average gate line widths for semiconductor devices having a gate electrode with a vertical sidewall and for semiconductor devices having a gate electrode with a tapered sidewall, in accordance with the present approach.

However, it may be appreciated that the reflow bake process also presents challenges to the device design. For example, FIG. 8 is a graph 126 illustrating an average gate line width 127 for semiconductor devices manufactured using a typical photoresist layer as well as an average gate line width 128 for semiconductor device embodiments (e.g., device 40) manufactured using the presently disclosed rounded photoresist layer 72. As illustrated in the graph 126, while the typical photoresist layer provides a certain average gate line width 127, the rounded photoresist layer 72 provides an average gate line width 128 that is larger (e.g., 0.1%, 0.2%, 0.3%, 0.4%, 0.5%, or 1% greater) than the average gate line width 127. Accordingly, since smaller gate line widths are typically desirable, one of skill in the art may hesitate in implementing the tapered gate electrode design presently disclosed. However, for certain device structures, the benefits provided by the presently disclosed tapered sidewall 42 to the reliability and performance of the resulting semiconductor device 40 may exceed the negative impacts of the greater gate line width afforded by the present approach.

As mentioned above, FIG. 9 illustrates an embodiment of a process 130 (represented by block 100 of FIG. 5) that describes plasma etching of the semiconductor device 40. The illustrated process 130 includes plasma etching (block 132) through the metal silicide layer 44 of the gate electrode 12 at the edges of the photoresist layer 72 to provide the metal silicide layer 44 with substantially vertical edges 50. The illustrated process 130 also includes plasma etching (block 134) through the polysilicon layer 46 of the gate electrode 12 below the substantially vertical edges of the metal silicide layer 44 to provide the polysilicon layer 46 with substantially tapered edges 54. As such, it may be appreciated that the actions described in block 132 and 134 may provide the gate electrode 12 having the tapered sidewall 42. Further, as mentioned above, in certain embodiments, the process 130 may include etching (block 136) (e.g., plasma or wet etching) away a surface layer (e.g., approximately 100 Å) of the portion of the gate oxide layer 24 that is not disposed below the gate electrode 12. It may be appreciated that, at certain points during the etching process, at least a portion of the etching described in blocks 132, 134, and 136 may occur simultaneously as the surface of the semiconductor device is exposed to etching conditions in certain embodiments.

It should also be appreciated that the disclosed rounded photoresist layer 72 (e.g., having the rounded or tapered edge 76) helps to prevent the accumulation of residue (e.g., etch byproducts) during the plasma etching process 130. That is, for a semiconductor device having a photoresist layer that does not undergo a reflow bake, during plasma etching, inorganic etch products can build up on vertical sidewalls of the photoresist layer. Subsequently, when the photoresist is subsequently removed (e.g., using plasma ashing), the inorganic etch products may remain behind, possibly imparting undesired conductivity to the gate oxide layer 24. Further, these inorganic residues may be exceedingly difficult to remove, even with wet cleaning steps post ashing. However, these inorganic residues are not collected on the surface of the rounded photoresist layer 72 during plasma etching since they are etched away faster than they are deposited, which enables a cleaner device surface after the photoresist layer 72 is removed (e.g., using plasma ashing). Accordingly, the presently disclosed rounded photoresist layer 72 may prevent residue build-up and deposition, enabling the fabrication of semiconductor devices with better reliability and performance.

Technical effects of the invention include improving the reliability and performance of semiconductor devices. In particular, present embodiments improve the reliability of the gate oxide layer of MOS devices by utilizing a gate electrode having tapered sidewalls. As discussed above, during plasma etching, a photoresist layer having rounded edges (e.g., from a reflow bake process) imparts tapered edges to the sidewalls of the gate electrode. Additionally, during plasma etching, the rounded photoresist layer may not accumulate inorganic etch byproducts, resulting in a cleaner gate oxide layer after photoresist removal. Further, during plasma etching, the tapered sidewall of the gate electrode results in less trenching of the underlying gate oxide, which may further improve the quality of the gate oxide layer. Further, these tapered sidewalls MOS devices demonstrate improved the performance and reliability during operation. As such, the presently disclosed tapered gate electrode and higher quality gate oxide layer enable the fabrication of a semiconductor device having better performance and reliability when compared to the similar semiconductor devices having gate electrodes with substantially vertical sidewalls.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An intermediate silicon carbide (SiC) semiconductor device structure, comprising:
   a gate oxide layer disposed on top of a SiC semiconductor layer;
   a gate electrode comprising:
      a polysilicon layer disposed on top of the gate oxide layer, wherein the polysilicon layer comprises a first edge that is disposed at a first angle with respect to the gate oxide layer, wherein the first angle is between 65 degrees and 85 degrees, and
      a metal silicide layer disposed on top of the polysilicon layer, wherein the metal silicide layer comprises a second edge that is disposed at a second angle with respect to the polysilicon layer, wherein the second angle is between 80 degrees and 100 degrees; and
   a rounded photoresist layer disposed on top of the gate electrode, wherein the rounded photoresist layer comprises a third edge that is disposed at a third angle with respect to the gate electrode, wherein the third angle is between 30 degrees and 70 degrees, and wherein a measure of the first angle, a measure of the second angle, and a measure of the third angle are different.

2. The intermediate SiC semiconductor device structure of claim 1, wherein the metal silicide layer comprises one or more of tantalum silicide, nickel silicide, cobalt silicide, titanium silicide, molybdenum silicide, tungsten silicide, niobium silicide, hafnium silicide, zirconium silicide, vanadium silicide, chromium silicide, or platinum silicide.

3. The intermediate SiC semiconductor device structure of claim 1, wherein a width of the metal silicide layer is equal to a top width of the polysilicon layer.

4. The intermediate SiC semiconductor device structure of claim 1, wherein the metal silicide layer comprises tantalum silicide.

5. The intermediate SiC semiconductor device structure of claim 4, wherein the tantalum silicide comprises between 2 and 4 silicon atoms for each tantalum atom.

6. The intermediate SiC semiconductor device structure of claim 5, wherein the tantalum silicide comprises 3.3 silicon atoms for each tantalum atom.

7. The intermediate SiC semiconductor device structure of claim 1, wherein a portion of the gate oxide layer disposed near the first edge of the polysilicon layer is free from trench defects and etch byproducts.

8. The intermediate SiC semiconductor device structure of claim 1, wherein the gate oxide layer is free of microtrenching near the first edge of the polysilicon layer of the gate electrode.

9. The intermediate SiC semiconductor device structure of claim 1, wherein a first portion of the gate oxide layer is disposed directly below the gate electrode and microtrenching in a second portion of the gate oxide layer includes a trench defect disposed near the first edge of the polysilicon layer.

10. The intermediate SiC semiconductor device structure of claim 9, wherein the trench defect has a depth of 120 angstroms or less.

11. The intermediate SiC semiconductor device structure of claim 9, wherein the second portion of the gate oxide layer is between 20% and 35% thinner than the first portion of the gate oxide layer.

12. The intermediate SiC semiconductor device structure of claim 1, wherein the gate oxide layer is free of inorganic etching byproducts near the first edge of the polysilicon layer of the gate electrode.

13. The intermediate SiC semiconductor device structure of claim 1, wherein the rounded photoresist layer has a semielliptical shape and a curved top surface.

14. An intermediate silicon carbide (SiC) semiconductor device structure, comprising:
   a SiC semiconductor layer;
   a gate oxide layer disposed on top of the SiC semiconductor layer;
   a gate electrode comprising:
      a polysilicon layer disposed on top of the gate oxide layer, wherein the polysilicon layer comprises a first edge that is disposed at a first angle with respect to the gate oxide layer, wherein the first angle is between 65 degrees and 85 degrees, and
      a tantalum silicide layer disposed on top of the polysilicon layer, wherein the tantalum silicide layer comprises a second edge that is disposed at a second angle with respect to the polysilicon layer, wherein the second angle is between 80 degrees and 100 degrees; and
   a rounded photoresist layer disposed on top of the gate electrode, wherein the rounded photoresist layer comprises a third edge that is disposed at a third angle with respect to the gate electrode, wherein the third angle is between 30 degrees and 70 degrees, and wherein a measure of the first angle, a measure of the second angle, and a measure of the third angle are different.

15. The intermediate SiC semiconductor device structure of claim 14, wherein a first portion of the gate oxide layer disposed directly under the polysilicon layer of the gate electrode has a first thickness of 500 angstroms, and wherein a second portion of the gate oxide layer disposed adjacent to the polysilicon layer of the gate electrode has a second thickness between 275 angstroms and 400 angstroms.

16. The intermediate SiC semiconductor device structure of claim 14, wherein a first portion of the gate oxide layer that is not disposed directly under the polysilicon layer of the gate electrode is between 20% and 35% thinner than a second portion of the gate oxide layer that is disposed directly under the polysilicon layer of the gate electrode.

17. The intermediate SiC semiconductor device structure of claim 14, wherein a first portion of the gate oxide layer that is not disposed directly under the polysilicon layer of the gate electrode is between 75 angstroms and 200 angstroms thinner than a second portion of the gate oxide layer that is disposed directly under the polysilicon layer of the gate electrode.

18. An intermediate silicon carbide (SiC) device structure, comprising:
   a gate oxide layer disposed on top of a SiC semiconductor layer;
   a gate electrode layer comprising:
      a polysilicon layer disposed on top of the gate oxide layer, wherein the polysilicon layer comprises a first edge that is disposed at a first angle with respect to the gate oxide layer, and
      a tantalum silicide layer disposed on top of the polysilicon layer, wherein the tantalum silicide layer comprises a second edge that is disposed at a second angle with respect to the polysilicon layer; and
   a rounded photoresist layer disposed on top of the gate electrode layer and comprising a third edge that is disposed at a third angle between 30 degrees and 70 degrees with respect to the gate electrode layer, wherein the third edge of the rounded photoresist layer blocks lateral etching in a portion of the polysilicon layer adjacent to the gate oxide layer during plasma etching of the intermediate SiC device structure, and wherein a measure of the first angle, a measure of the second angle, and a measure of the third angle are different.

19. The intermediate SiC semiconductor device structure of claim 18, wherein the third angle is between 40 degrees and 60 degrees.

20. The intermediate SiC semiconductor device structure of claim 19, wherein the third angle is between 45 degrees and 55 degrees.

* * * * *